(12) United States Patent
Hsieh et al.

(10) Patent No.: US 12,046,543 B2
(45) Date of Patent: Jul. 23, 2024

(54) PACKAGE SUBSTRATE AND CHIP PACKAGE STRUCTURE USING THE SAME

(71) Applicant: REALTEK SEMICONDUCTOR CORP., Hsinchu (TW)

(72) Inventors: Han-Chieh Hsieh, Hsinchu (TW); Chao-Min Lai, Hsinchu (TW); Cheng-Chen Huang, Hsinchu (TW); Nan-Chin Chuang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 158 days.

(21) Appl. No.: 17/679,862

(22) Filed: Feb. 24, 2022

(65) Prior Publication Data

US 2022/0278033 A1 Sep. 1, 2022

(30) Foreign Application Priority Data

Feb. 26, 2021 (TW) .................................. 110106907

(51) Int. Cl.
*H01L 23/498* (2006.01)
*H01L 23/00* (2006.01)

(52) U.S. Cl.
CPC .. *H01L 23/49822* (2013.01); *H01L 23/49838* (2013.01); *H01L 24/16* (2013.01); *H01L 2224/16227* (2013.01)

(58) Field of Classification Search
None
See application file for complete search history.

(56) References Cited

U.S. PATENT DOCUMENTS

| 11,055,469 | B2 * | 7/2021 | Peng | H01L 23/5286 |
| 2021/0296235 | A1 * | 9/2021 | Hsu | H01L 23/5286 |
| 2022/0278033 | A1 * | 9/2022 | Hsieh | H01L 23/50 |

* cited by examiner

*Primary Examiner* — Long Pham
(74) *Attorney, Agent, or Firm* — Li & Cai Intellectual Property (USA) Office

(57) ABSTRACT

A package substrate and a chip package structure using the same are provided. The package substrate includes a laminated board including first to third wiring layers, a pad array, a plurality of ground conductive structures, and a plurality of power conductive structures. At least one of the ground (or power) conductive structures includes two first ground (or power) conductive posts and a second ground (or power) conductive post. The two first ground (or power) conductive posts and the second ground (or power) conductive post are arranged along a first direction, and the second ground (or power) conductive post is located between two orthographic projections of the two first ground (or power) conductive posts. Each of the ground conductive structures in a first column and each of the power conductive structures in a second column are offset from each other in a second direction.

14 Claims, 7 Drawing Sheets

PACKAGE SUBSTRATE AND CHIP PACKAGE STRUCTURE USING THE SAME

CROSS-REFERENCE TO RELATED PATENT APPLICATION

This application claims the benefit of priority to Taiwan Patent Application No. 110106907, filed on Feb. 26, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package substrate and a chip package structure using the same, and more particularly to a package substrate for a flip-chip package and a chip package structure using the same.

BACKGROUND OF THE DISCLOSURE

A conventional integrated circuit chip packaged component usually includes an integrated circuit (IC) chip and a package board, and the IC chip is disposed on the package board. The package board includes an interconnection structure and a solder ball array that is located at a bottom side of the package board. The interconnection structure includes a plurality of ground vias and a plurality of power vias, so as to establish a power supply path for the IC chip. The solder ball array includes a plurality of solder balls to serve as external contacts. When the IC chip is disposed on the package board, the IC chip can be electrically connected to a circuit board through the interconnection structure that is located inside of the package board and the solder ball array.

However, as the integrated circuit chip packaged component provides more functions and operates at increased speeds, the power consumption of the integrated circuit chip packaged component will also increase. If the power supply path established by the interconnection structure is not properly designed, the integrated circuit packaged component for high-speed operation or having high power consumption can have an operating speed lower than an expected standard or fail as a result of a voltage being too low.

To be more specific, during operation of the integrated circuit chip packaged component, the IC chip needs to be switched from a low-power state to a high-power state within a short period of time. Therefore, the power supply voltage is required to have a much higher stability. Currently, during operation of the conventional integrated circuit chip packaged component (such as a large-scale system on chip (SoC)), an operating current needs to be rapidly increased within a short time. Since a parasitic inductance or a parasitic impedance can be generated on the interconnection structure, an increase of a transient current and the parasitic inductance result in a transient voltage drop, thereby reducing power integrity. Furthermore, an electric circuit failure can be caused by the voltage being too low.

Accordingly, how the power supply path can be designed to effectively improve the power integrity of the integrated circuit chip packaged component during operation without increasing the size thereof is still one of the important issues to be solved in this industry.

SUMMARY OF THE DISCLOSURE

In response to the above-referenced technical inadequacies, the present disclosure provides a package substrate and a chip package structure using the same, so as to improve power integrity of the chip package structure during operation.

In one aspect, the present disclosure provides a package substrate including a laminated board, a pad array, a plurality of ground conductive structures, and a plurality of power conductive structures. The laminated board includes at least a first wiring layer, a second wiring layer, and a third wiring layer. The first wiring layer is located at an outermost side of the laminated board, and the second wiring layer is located between the first wiring layer and the third wiring layer. The pad array is electrically connected to the first wiring layer, and the pad array includes a plurality of power pad groups and a plurality of ground pad groups. The ground conductive structures are arranged into a first column in a first direction. At least one of the ground conductive structures includes two first ground conductive posts both extending from the first wiring layer to the second wiring layer, and a second ground conductive post extending from the second wiring layer to the third wiring layer. The two first ground conductive posts and the second ground conductive post are arranged along the first direction, and the second ground conductive post is located between two orthographic projections of the two first ground conductive posts. The power conductive structures are arranged into a second column in the first direction, and at least one of the power conductive structures includes two first power conductive posts both extending from the first wiring layer to the second wiring layer, and a second power conductive post extending from the second wiring layer to the third wiring layer. The two first power conductive posts and the second power conductive post are arranged along the first direction, and the second power conductive post is located between two orthographic projections of the two first power conductive posts. Each of the ground conductive structures in the first column and each of the power conductive structures in the second column are respectively offset from each other in a second direction.

In another aspect, the present disclosure provides a chip package structure that includes a chip and the above-mentioned package substrate. The chip includes a plurality of contacts located at a bottom side thereof, and is disposed on the package substrate through the contacts. The contacts correspond in position to the pad array.

Therefore, in the package substrate and the chip package structure using the same provided by the present disclosure, by virtue of "at least one ground conductive structure in the first column (or first row) including two first ground conductive posts and a second ground conductive post that are arranged along the first direction, and the second ground conductive post being located between two orthographic projections of the two first ground conductive posts," "at least one power conductive structure in the second column (or second row) including two first power conductive posts and a second power conductive post that are arranged along the first direction, and the second power conductive post being located between two orthographic projections of the two first power conductive posts," and "each of the ground conductive structures in the first column and each of the power conductive structures in the second column being offset from each other in a second direction," a distribution density of power supply paths in the chip package structure can be maximized, thereby improving the power integrity during operation of the chip package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
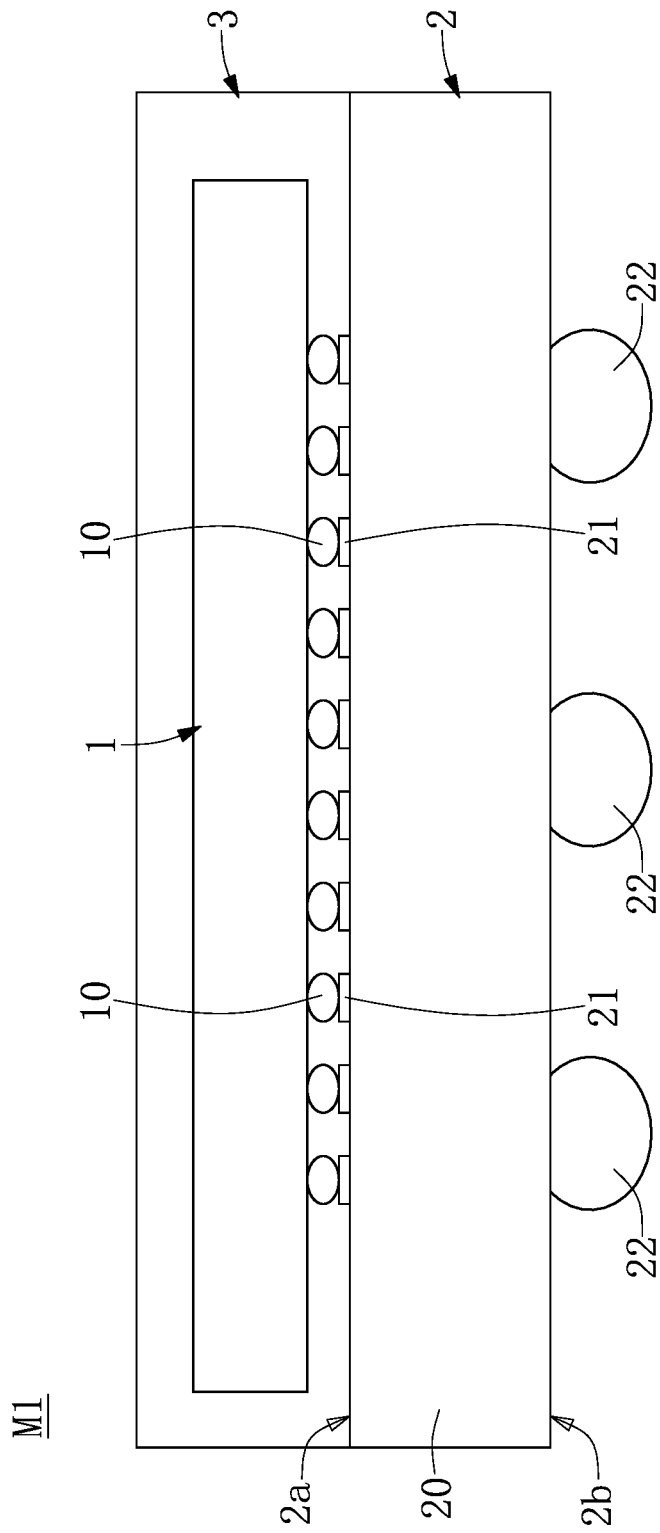
FIG. 1 is a partial schematic view of a chip package structure according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a partial schematic view of a chip package structure according to one embodiment of the present disclosure. A chip package structure M1 of the instant embodiment includes a chip 1, a package substrate 2, and a molding layer 3. The chip 1 is disposed on the package substrate 2, and the molding layer 3 covers the chip 1 and the package substrate 2.

The chip 1 is, for example, a system on chip (SoC), and is adapted for operation under a high frequency. In the embodiment of the present disclosure, the chip 1 is disposed on the package substrate 2 in a flip-chip manner. Accordingly, the chip 1 includes a plurality of contacts 10 that are located at a bottom side thereof, so that the chip 1 can be disposed on and electrically connected to the package substrate 2 through the contacts 10. The chip 1 can be electrically connected to another circuit board through a circuit layout configured in the package substrate 2.

Figure 2:
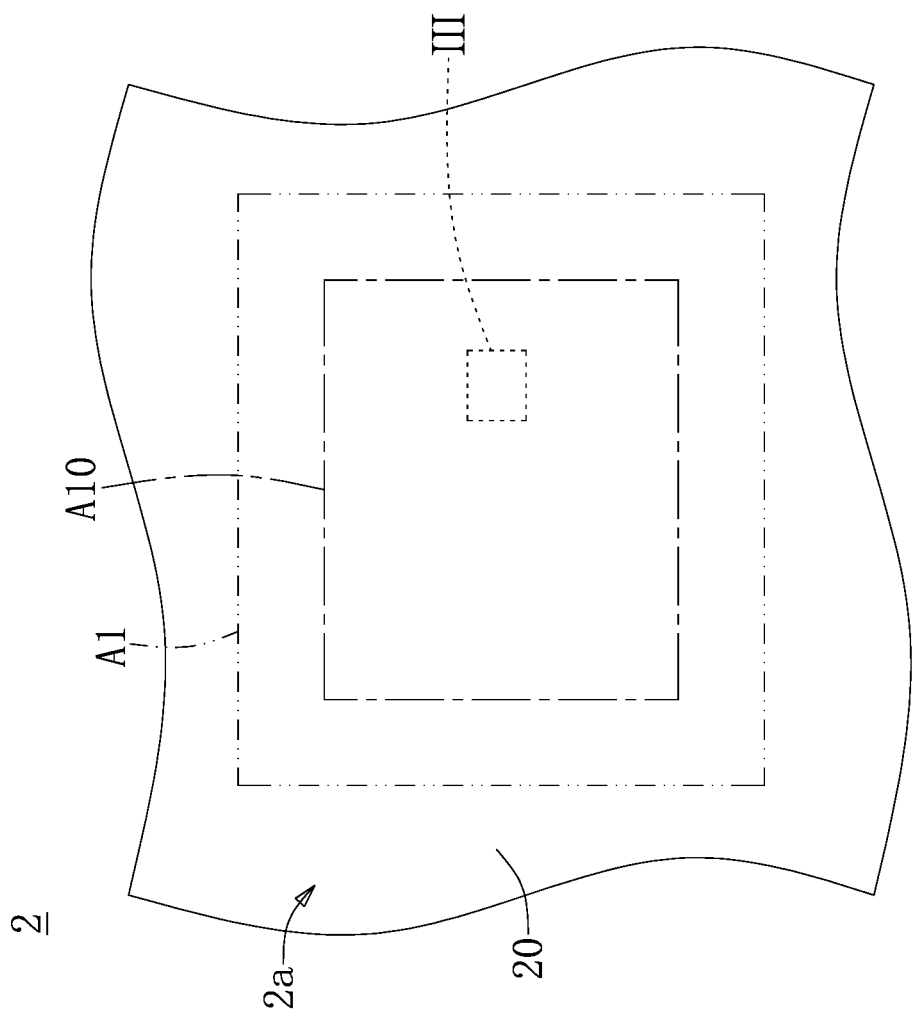
FIG. 2 is a schematic top view of a package substrate according to one embodiment of the present disclosure.

Reference is made to FIG. 1 and FIG. 2. FIG. 2 is a schematic top view of a package substrate according to one embodiment of the present disclosure. The package substrate 2 of the embodiment in the present disclosure has a mounting side 2a and a bottom side 2b. The package substrate 2 has a chip arrangement region A1 defined at the mounting side 2a. When the chip 1 is disposed on the package substrate 2, the chip 1 is located in the chip arrangement region A1.

Furthermore, the package substrate 2 includes at least a laminated board 20, a pad array 21 and a grid ball array 22. The pad array 21 and the grid ball array 22 are respectively located at two opposite sides of the laminated board 20 (i.e., respectively located at the mounting side 2a and the bottom side 2b).

Figure 3:
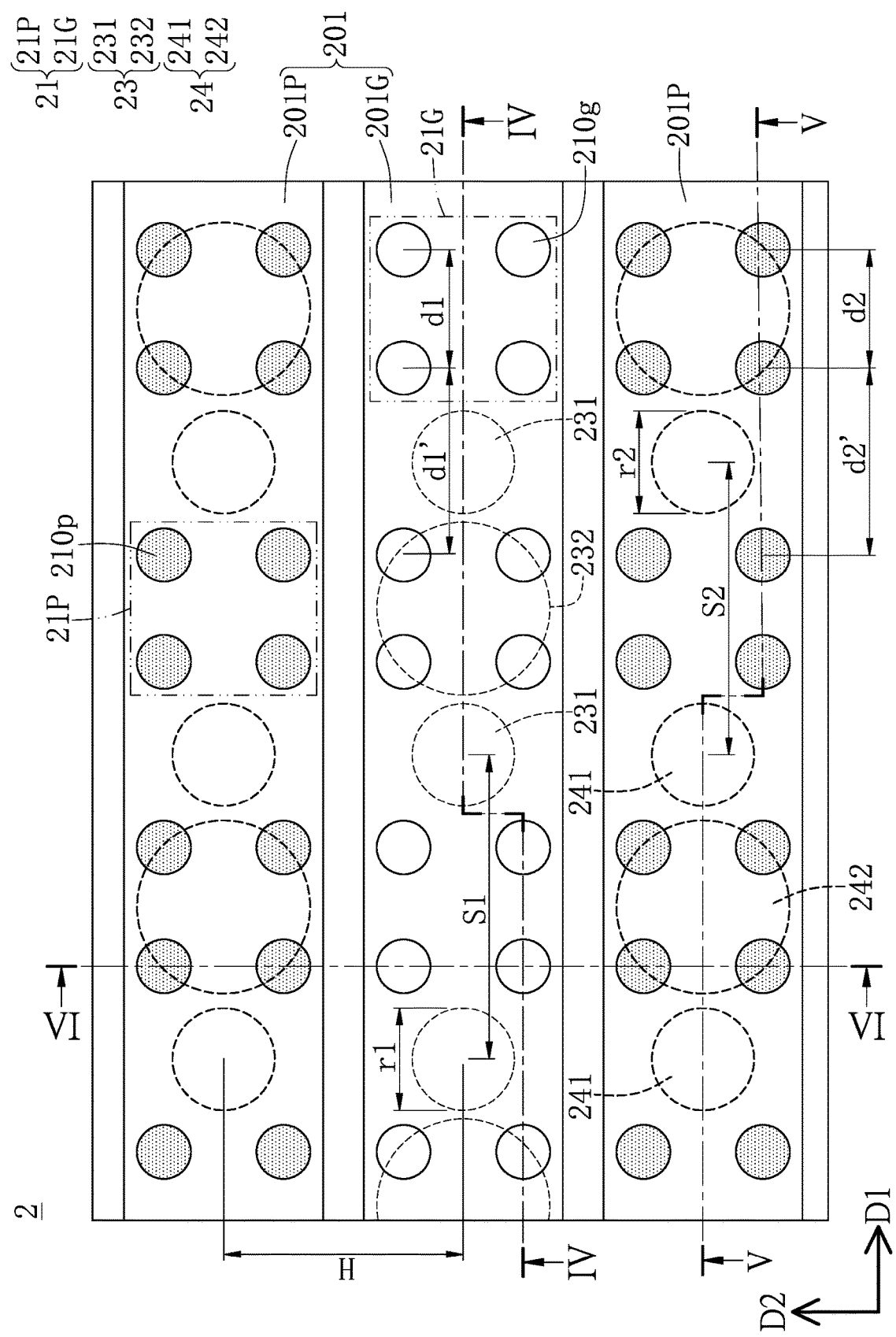
FIG. 3 is an enlarged view of part III of FIG. 2.
Figure 4:
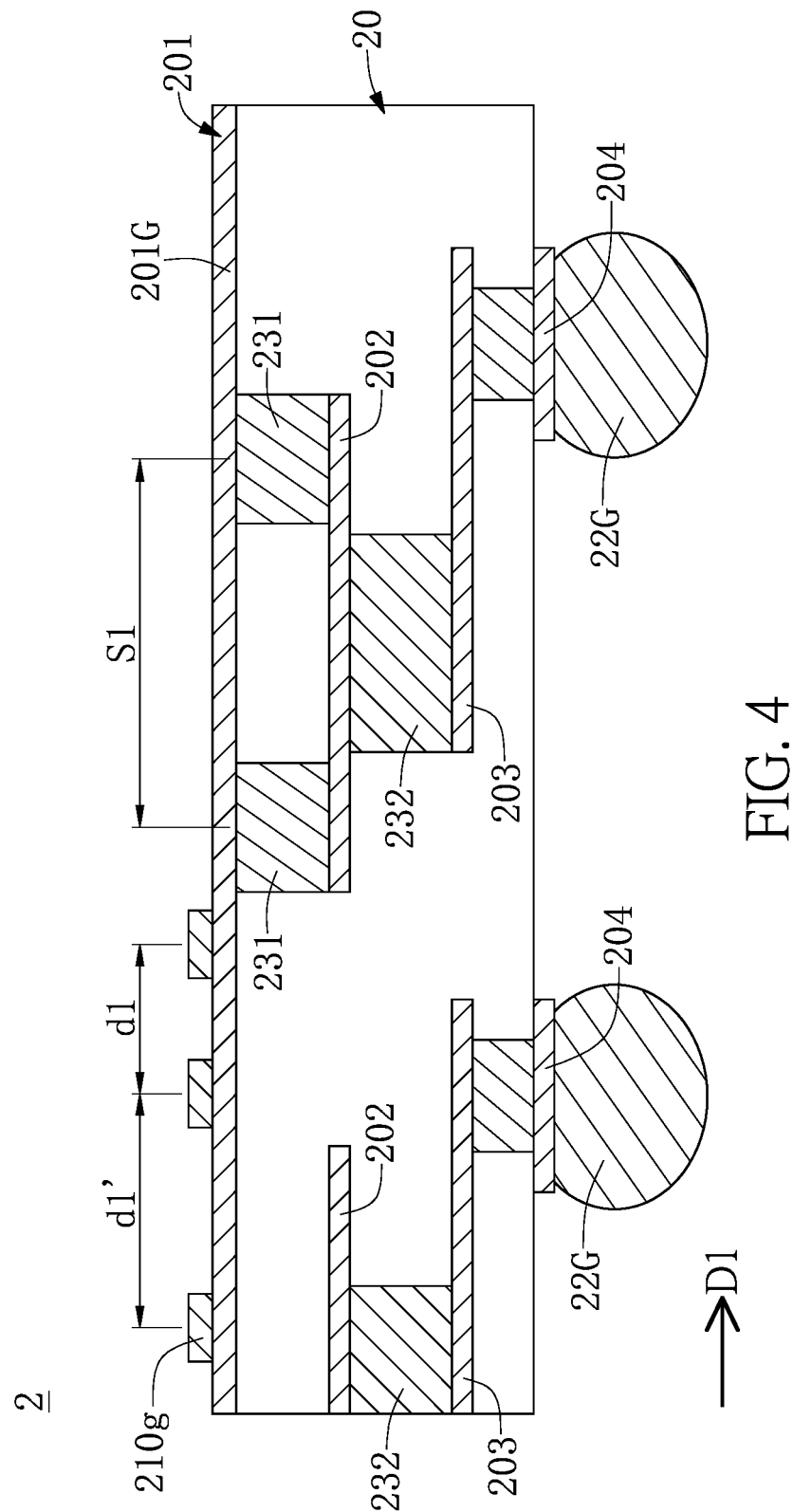
FIG. 4 is a cross-sectional view taken along line IV-IV of FIG. 3.
Figure 5:
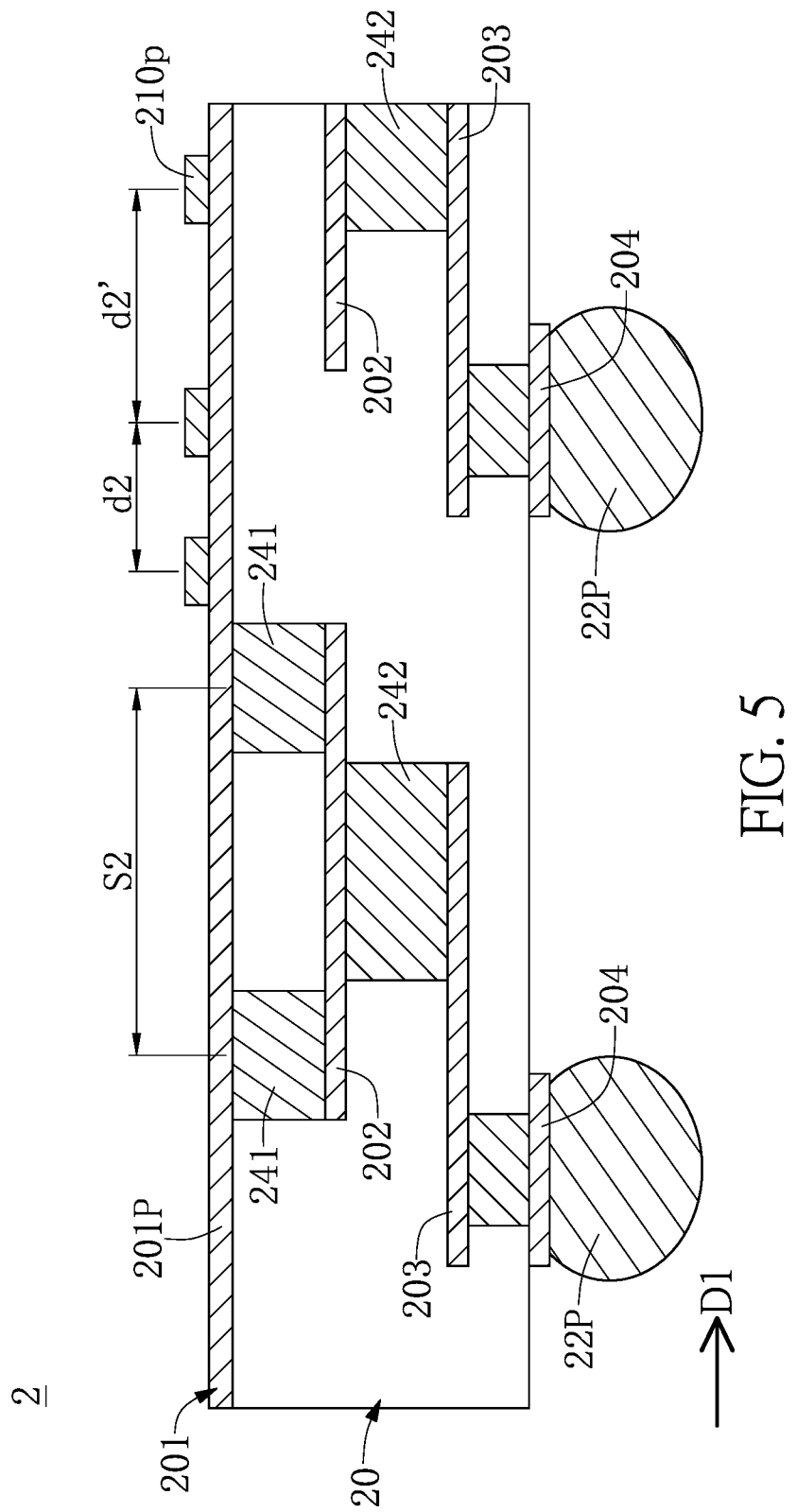
FIG. 5 is a cross-sectional view taken along line V-V of FIG. 3.

Reference is made to FIG. 3 to FIG. 5. FIG. 3 is an enlarged view of part III of FIG. 2, FIG. 4 is a cross-sectional view taken along line IV-IV of FIG. 3, and FIG. 5 is a cross-sectional view taken along line V-V of FIG. 3. The laminated board 20 includes a plurality of wiring layers 201-204 and a plurality of insulating layers (not labeled), and the wiring layers 201-204 and the insulating layers are alternately stacked on top of one another. That is to say, every two of the wiring layers 201-204 are spaced apart from each other by one of the insulating layers. In the instant embodiment, there are four wiring layers 201-204, which include a first wiring layer 201, a second wiring layer 202, a third wiring layer 203, and a fourth wiring layer 204. However, a number of the wiring layers 201-204 in the embodiment of the present disclosure is not limited to the example provided herein.

The first wiring layer 201 and the fourth wiring layer 204 are both disposed at outermost sides of the laminated board 20, and are respectively located at two opposite sides of the laminated board 20. Specifically, the first wiring layer 201 is located at the mounting side 2a of the package substrate 2, and the fourth wiring layer 204 is located at the bottom side 2b of the package substrate 2. Furthermore, the second wiring layer 202 and the third wiring layer 203 are located at an inside of the laminated board 20. In the embodiment of the present disclosure, the second wiring layer 202 is disposed between the first wiring layer 201 and the third wiring layer 203, and the third wiring layer 203 is disposed between the second wiring layer 202 and the fourth wiring layer 204.

Reference is made to FIG. 2 and FIG. 3. The pad array 21 is located at the mounting side 2a of the laminated board 20, and is electrically connected to the first wiring layer 201. The pad array 21 includes a plurality of power pad groups 21P and a plurality of ground pad groups 21G. The power pad groups 21P and the ground pad groups 21G are located in a central region A10 of the chip arrangement region A1. Each of the power pad groups 21P includes a plurality of power pads 210p, and each of the ground pad groups 21G includes a plurality of ground pads 210g.

Furthermore, as shown in FIG. 4 and FIG. 5, the grid ball array 22 is located at the bottom side 2b of the package substrate 2 and is electrically connected to the fourth wiring layer 204, so that the chip package structure M1 can be assembled to another circuit board. The grid ball array 22 includes a plurality of ground solder balls 22G and a plurality of power solder balls 22P.

In the embodiment of the present disclosure, the package substrate 2 further includes a plurality of ground conductive structures 23 and a plurality of power conductive structures 24. The ground and power conductive structures 23, 24 are embedded in the laminated board 20, so as to be electrically connected to the pad array 21 and the grid ball array 22 respectively located at two opposite sides of the laminated board 20 and to form a plurality of power supply paths. In the instant embodiment, by modifying designs of the power supply paths, power integrity and voltage stability of the chip package structure M1 during operation can be improved.

Specifically, the power pads 210p of the pad array 21 are correspondingly and electrically connected to the power solder balls 22P through the corresponding power conductive structures 24. Similarly, the ground pads 210g in the pad array 21 are correspondingly and electrically connected to the ground solder balls 22G through the corresponding ground conductive structures 23. However, arrangements of the power solder balls 22P and the ground solder balls 22G in the grid ball array 22 are not limited to the example provided in the present disclosure.

Reference is made to FIG. 3. The ground conductive structures 23 are arranged into a first column in a first direction D1. At least one of the ground conductive structures 23 includes two first ground conductive posts 231 and a second ground conductive post 232. It should be noted that the first wiring layer 201 can include a plurality of power traces 201P, so that the power pads 210p of each of the power pad groups 21P are electrically connected to the power conductive structures 24. The first wiring layer 201 can further include a plurality of ground traces 201G, so that the ground pads 210g of each of the ground pad groups 21G are electrically connected to the ground conductive structures 23. Moreover, the pad array 21 located at the mounting side 2a further includes a plurality of signal pad groups (not illustrated in the drawings) that are located in the chip arrangement region A1, and the signal pad groups are located at an outside of the central region A10. The present disclosure mainly provides a solution to increase the power supply paths in the package substrate 2, and configurations of the signal pad groups are not limited herein.

Reference is made to FIG. 4. Each of the first ground conductive posts 231 extends from the first wiring layer 201 to the second wiring layer 202, and the second conductive post 232 extends from the second wiring layer 202 to the third wiring layer 203. That is to say, each of the ground conductive structures 23 is configured to establish a plurality of ground paths extending from the ground pad groups 21G to the bottom side 2b of the laminated board 20.

In the embodiment of the present disclosure, two of the first ground conductive posts 231 and the second ground conductive post 232 are arranged along the first direction D1, and the second ground conductive post 232 is located between two orthographic projections of the two first ground conductive posts 231. From a top view, a connection line formed between two central points of the two first ground conductive posts 231 passes across the second ground conductive post 232, and is substantially parallel to the first direction D1. In one embodiment, in the same ground conductive structure 23, each of the first ground conductive posts 231 is arranged with an edge of the orthographic projection thereof being as close as possible to an edge of the second ground conductive post 232, so that the ground conductive structures 23 can be arranged more closely in the package substrate 2. Furthermore, in the instant embodiment, the second ground conductive post 232 has a transverse cross-sectional area greater than a transverse cross-sectional area of each of the first ground conductive posts 231.

Furthermore, referring to FIG. 3, each of the ground pad groups 21G is arranged between two of the first ground conductive posts 231 that are adjacent to each other in the first column. Accordingly, multiple ground pads 210g are arranged between any two adjacent ones of the first ground conductive posts 231 in the first column. As long as a pitch between two adjacent ones of the ground pads 210g is not less than a predetermined value, a number of the ground pads 210g arranged between any two adjacent ones of the first ground conductive posts 231 can be maximized. To be more specific, the number of the ground pads 210g can be adjusted according to a pitch between two adjacent ones of the first ground conductive posts 231 and a shortest pitch between two adjacent ones of the ground pads 210g that is allowed to meet the fabrication requirements.

It should be noted that the term "a pitch between the (ground or power) conductive posts" recited in the present disclosure indicates a shortest distance between central points of two adjacent ones of the conductive posts. Furthermore, in the present disclosure, either "a pad pitch" or "a pitch between the pads" recited in the present disclosure refers to a shortest distance between central points of two adjacent ones of the pads.

Furthermore, due to limitations set by fabrication conditions, the ground pads 210g, the power pads 210p, the first ground conductive posts 231, the second ground conductive posts 232, first power conductive posts 241, second power conductive posts 242 are each required to have a specific size and a specific pitch with respect to different package substrates 2 of different specifications. Accordingly, even if the power integrity can be improved by increasing the quantities of the ground pads 210g, the power pads 210p, the first ground conductive posts 231, the second ground conductive posts 232, the first power conductive posts 241, the second power conductive posts 242, the quantities thereof are still restricted to the above-mentioned specific requirements.

Reference is made to FIG. 4. The pitch (S1) between any two adjacent ones of the first ground conductive posts 231 in the first column, a diameter (r1) of each of the first ground conductive posts 231, the pitch (d1) between two adjacent ones of the ground pads 210g in the first or second direction D1 (D2), and a maximum number (N1) of the ground pads 210g that are allowed to be arranged between two adjacent ones of the first ground conductive posts 231 satisfy the following relationship: $(S1-r1)/d1 > N1$, in which N1 is a positive integer.

For example, in the first column, when the pitch S1 between any two adjacent ones of the first ground conductive posts 231 is about 280 μm, the diameter r1 of each of the first ground conductive posts 231 is about 100 μm, and the pitch d1 between two adjacent ones of the ground pads 210g in the first direction D1 (or in the second direction D2) is at least 80 μm, at most two ground pads 210g in each of the ground pad groups 21G are allowed to be arranged in the first direction D1. To be more specific, in the instant embodiment, the ground pads 210g in each of the ground pad groups 21G are arranged into a 2×2 array, but the present disclosure is not limited thereto. In another embodiment, when the pitch between two adjacent ones of the first ground conductive posts 231 is increased, the maximum number of the ground pads 210g in each of the ground pad groups 21G can also be increased.

Reference is made to FIG. 3. One of the ground pad groups 21G is located between two adjacent ones of the ground conductive structures 23, and does not overlap with any second ground conductive post 232 in a thickness direction of the laminated board 20. In another ground pad group 21G, a portion of each of the ground pads 210g overlap with one of the second ground conductive posts 232 in the thickness direction.

Reference is made to FIG. 3 and FIG. 5. Similarly, the power conductive structures 24 are arranged into a second column in the first direction D1. At least one of the power conductive structures 24 includes two first power conductive posts 241 and one second power conductive post 242. Each of the first power conductive posts 241 extends from the first wiring layer 201 to the second wiring layer 202. The second power conductive post 242 extends from the second wiring layer 202 to the third wiring layer 203. In the instant embodiment, the two first power conductive posts 241 and the second power conductive post 242 are arranged in the first direction, and the second power conductive post 242 is located between two orthographic projections of the two first power conductive posts 241.

That is to say, from a top view, a connection line formed between two central points of the two first power conductive posts 241 passes across the second power conductive post 242, and is substantially parallel to the first direction D1. Furthermore, the second power conductive post 242 has a cross-sectional area in a transvers direction greater than that of each of the first power conductive posts 241. In one embodiment, in the same power conductive structure 24, each of the first power conductive posts 241 is arranged with an edge of the orthographic projection thereof being as close as possible to an edge of the second power conductive post 242, so as to increase a distribution density of the power conductive structures 24 in the package substrate 2.

Reference is made to FIG. 3. In the instant embodiment, each of the ground conductive structures 23 in the first column is offset from each of the power conductive structures 24 in the second column. That is to say, the ground conductive structure 23 and the power conductive structure 24 that is closest thereto are not in alignment with each other in the second direction D2. Specifically, in the instant embodiment, one of the first ground conductive posts 231 and one of the first power conductive posts 241 that is closest thereto are in alignment with each other in the second direction D2. However, a connection line formed between two central points of the second ground conductive post 232 and the second power conductive post 242 closest thereto is not parallel to the first direction D1, and forms an angle with the first direction D1. In one embodiment, a shortest distance between the edges of the second power conductive post 242 and the second ground conductive post 232 that is closest thereto is at least 35 μm. The first and second columns have a column pitch H therebetween that is at least 160 μm.

Reference is made to FIG. 3. Each of the power pad groups 21P is arranged between two adjacent ones of the first power conductive posts 241 in the second column. That is to say, as long as a pitch between two adjacent ones of the power pads 210p is not less than a predetermined value, a number of the power pads 210p that are arranged between any two adjacent ones of the first power conductive posts 241 can be maximized. To be more specific, the number of the power pads 210p can be adjusted according to a pitch between two adjacent ones of the first power conductive posts 241 and a shortest pitch between two adjacent ones of the power pads 210p.

Reference is made to FIG. 3. When any two adjacent ones of the first power conductive posts 241 in the second column have a pitch S2 therebetween, each of the first power conductive posts 241 has a diameter r2, and two of the power pads 210p have a pitch in the first direction D1 that is equal to or greater than a value d2, in each of the power pad groups 21P, a maximum number of the power pads 210p that are allowed to be placed between the two adjacent ones of the first power conductive posts 241 along the first direction D1 is equal to a value N2. S2, r2, d2, and N2 satisfy the following relationship: $(S2-r2)/d2 > N2$, in which N2 is a positive integer.

In the instant embodiment, the power pads 210p in each of the power pad groups 21P are arranged into a 2×2 array, but the present disclosure is not limited thereto. In another embodiment, if the pitch between any two adjacent ones of the first power conductive posts 241 is increased, the maximum number of the power pads 210p in each of the power pad groups 21P can also be increased.

Reference is made to FIG. 3 and FIG. 5. One of the power pad groups 21P is located between two adjacent ones of the power conductive structures 24, and does not overlap with any second power conductive post 242 in the thickness direction of the laminated board 20. In another one of the power pad groups 21P, the power pads 210p at least partially overlap with one of the second power conductive posts 242 in the thickness direction.

Through the above-mentioned configuration, with respect to different package substrates 2 of different specifications, the ground pads 210g, the power pads 210p, the ground conductive structures 23, and the power conductive structures 24 can be arranged so as to satisfy specific requirements and jointly form power supply paths having a higher distribution density.

Figure 6:
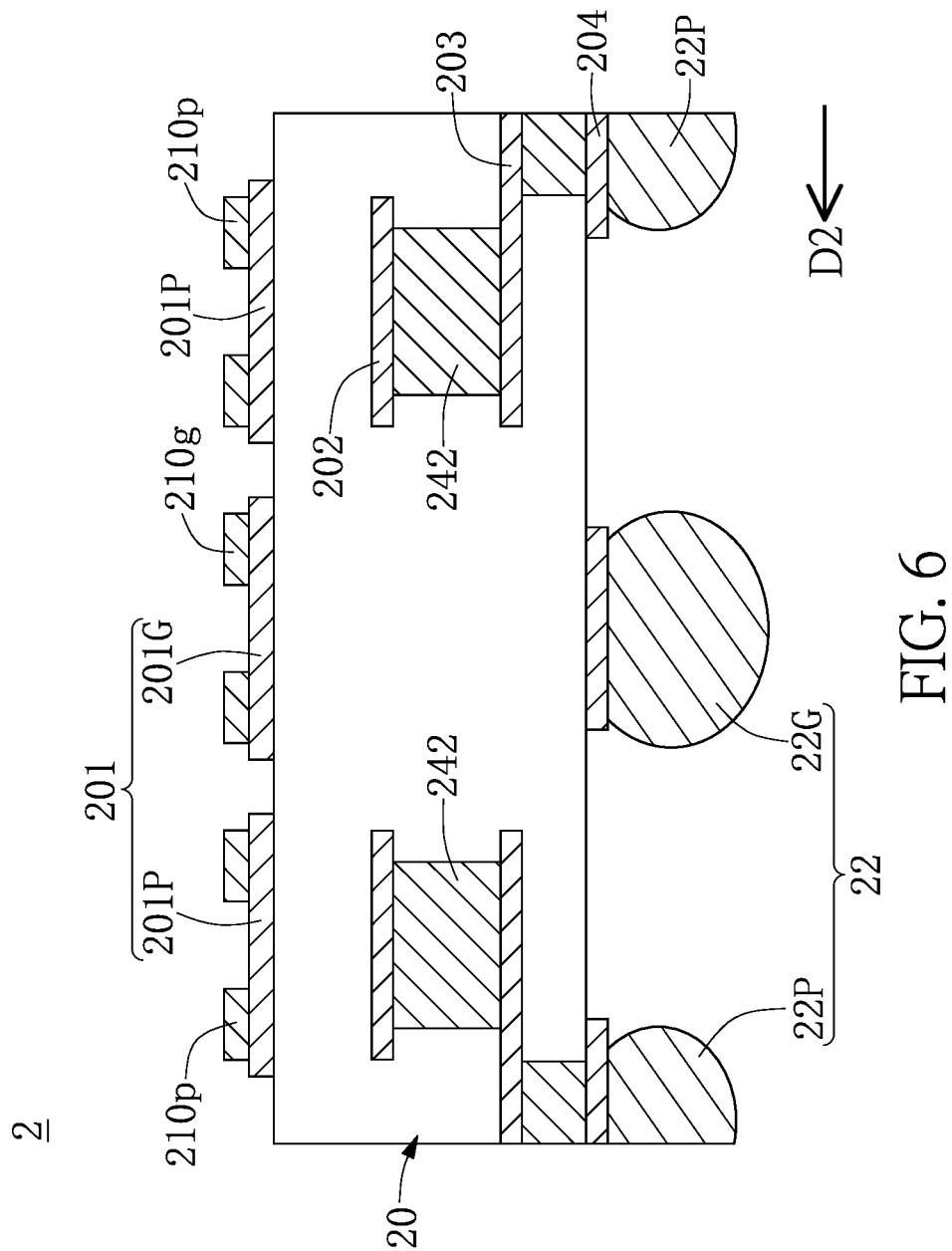
FIG. 6 is a cross-sectional view taken along line VI-VI of FIG. 3.

Reference is made to FIG. 3 and FIG. 6, in which FIG. 6 is a cross-sectional view taken along line VI-VI of FIG. 3. In the instant embodiment, the ground pad groups 21G and the power pad groups 21P are alternately arranged in the second direction D2 so as to form a plurality of rows. As shown in FIG. 6, in the second direction D2, the ground pads 210g and the power pads 210p are alternately arranged to form at least one row. Specifically, in each row, every two ground pads 210g and every two power pads 210p are alternately arranged. That is to say, two of the power pads 210p are arranged in a space defined between every two adjacent ones of the ground pads 210g, and two of the ground pads 210g are arranged in a space defined between every two adjacent ones of the power pads 210p, but the present disclosure is not limited thereto. In another embodiment, in each row, every three ground pads 210g and every three power pads 210p are alternately arranged.

Furthermore, referring to FIG. 3, the pitch d1 between two adjacent ones of the ground pads 210g in the same ground pad group 21G is less than a pitch d1' between two of the ground pads 210g that are the closest to each other and are respectively in two adjacent ones of the ground pad groups 21G. Similarly, the pitch d2 between two adjacent ones of the power pads 210p in the same power pad group 21P is less than a pitch d2' between two of the power pads 210p that are the closest to each other and are respectively in two adjacent ones of the power pad groups 21P.

In the present disclosure, each of the ground conductive structures 23 and each of the power conductive structures 24 are offset from one another, so that an area defined by a current loop can be reduced. The current loop is formed by the corresponding power pad group 21P, the corresponding power conductive structure 24, the corresponding ground pad group 21G and the corresponding ground conductive structure 23. As such, the parasitic inductance can be significantly reduced as the area of the current loop is reduced. Since the parasitic inductance is reduced, a voltage variation caused by the parasitic inductance and a transient current can be further attenuated, thereby improving the power integrity.

It is worth mentioning that, through arrangements of the power pad groups 21P, the ground pad groups 21G, the power conductive structures 24 and the ground conductive structures 23 provided in the embodiments of the present disclosure, distribution densities of the ground pads 210g, the power pads 210p, the first power conductive posts 241, the second power conductive posts 242, the first ground conductive posts 231, and the second ground conductive posts 232 can be maximized. Accordingly, during operation of the chip 1 that is electrically connected to another circuit board through the package substrate 2, the package substrate 2 can provide a relatively shorter power supply path for any one of interior elements in the chip 1, so as to reduce impedance.

Figure 7:
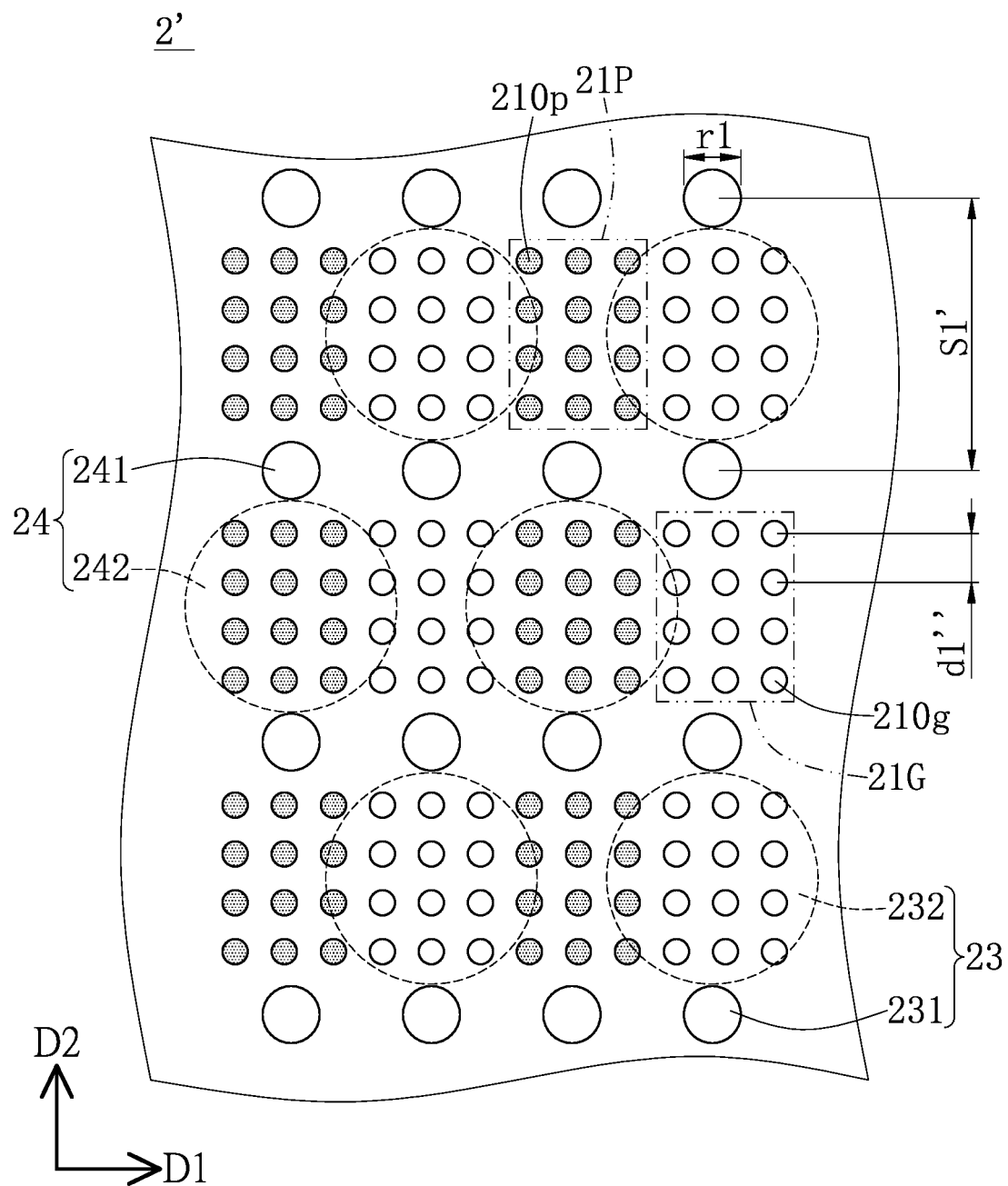
FIG. 7 is a partial schematic top view of a package substrate according to another embodiment of the present disclosure.

Reference is made to FIG. 7, which is a partial schematic top view of a package substrate according to another embodiment of the present disclosure. In the embodiment shown in FIG. 7, the elements that are the same or similar to those of the embodiment shown in FIG. 3 are denoted by the same reference numerals, and will not be reiterated herein. Furthermore, in a package substrate 2' shown in FIG. 7, the first wiring layer 201 is not illustrated.

In the package substrate 2' of the instant embodiment, the ground conductive structures 23 are arranged into a first row in the second direction D2, and the power conductive structures 24 are arranged into a second row in the second direction D2. Each of the ground conductive structure 23 in the first row and each of the power conductive structures 24 in the second row are offset from each other. Specifically, a connection line formed between two central points of the second ground conductive post 232 and the second power conductive post 242 that are closest to each other is not parallel to and forms an angle with the first direction D1.

Similar to the previous embodiment, from a top view, each of the ground pad groups 21G is arranged between two adjacent ones of the first ground conductive posts 231 in the first row, and each of the power pad groups 21P is arranged between two adjacent ones of the first power conductive posts 241 in the second row.

In the first row, since a pitch between any two adjacent ones of the first ground conductive posts 231 is greater than the pitch (S1) shown in FIG. 4, more ground pads 210g in each of the ground pad groups 21G are allowed to be placed between any two adjacent ones of the first ground conductive posts 231. Accordingly, as long as a pitch between any two pads (for example, two ground pads 210g, two power pads 210p, or one ground pad 210g and one power pad 210p) in the first direction D1 (or the second direction D2) satisfies the specification of the package substrate 2, 2', a number of the ground pads 210g in each ground pad group 21G and a number of the power pads 210p in each power pad group 21P are not limited in the present disclosure.

In the first row, the pitch (S1') between any two adjacent ones of the first ground conductive posts 231 in the second direction D2, a diameter (r1) of each of the first ground conductive posts 231, the pitch (d1") between two adjacent ones of the ground pads 210g in the second direction D2, and a maximum number (N1) of the ground pads 210g that are allowed to be arranged between two adjacent ones of the first ground conductive posts 231 satisfy the following relationship: (S1'−r1)/d1">N1, in which N1 is a positive integer.

For example, in the first row, when the pitch S1' between any two adjacent ones of the first ground conductive posts 231 is about 450 μm, the diameter r1 of each of the first ground conductive posts 231 is about 100 μm, and the pitch d1" between two adjacent ones of the ground pads 210g in the second direction D2 is at least 80 μm, at most four ground pads 210g in each of the ground pad groups 21G are allowed to be arranged in the second direction D2.

As shown in FIG. 7, the ground pads 210g in each of the ground pad groups 21G are arranged into a 4×3 array, but the present disclosure is not limited thereto. Similarly, in the second row, the power pads 210p in each of the power pad groups 21P can be arranged into a 4×3 array between any two adjacent ones of the first power conductive posts 241.

Furthermore, it is worth mentioning that the second ground conductive posts 232 in the instant embodiment and those in the embodiment shown in FIG. 2 have different diameters. However, by arranging the ground conductive structures 23 and the power conductive structures 24 in a staggered manner, arranging each of the ground pad groups 21G between two adjacent ones of the first ground conductive posts 231, and arranging each of the power pad groups 21P between two adjacent ones of the first power conductive posts 241, the distribution density of the power supply paths can be maximized, thereby improving the power integrity during operation of the chip package structure M1.

Beneficial Effects of the Embodiments

In conclusion, in the package substrate 2(2') and the chip package structure M1 using the same provided by the present disclosure, by virtue of "at least one ground conductive structure 23 in the first column (or first row) including two first ground conductive posts 231 and a second ground conductive post 232 that are arranged along the first direction D1, and the second ground conductive post 232 being located between two orthographic projections of the two first ground conductive posts 231," "at least one power conductive structure 24 in the second column (or second row) including two first power conductive posts 241 and a second power conductive post 242 that are arranged along the first direction D1, and the second power conductive post 242 being located between two orthographic projections of the two first power conductive posts 241," and "each of the ground conductive structures 23 in the first column and each of the power conductive structures 24 in the second column being offset from each other in a second direction D2," the distribution density of the power supply paths can be maximized, thereby improving the power integrity during operation of the chip package structure M1.

To be more specific, each of the ground pad groups 21G is arranged between any two adjacent ones of the first ground conductive posts 231 in the first column (or in the first row), and each of the power pad groups 21P is arranged between any two adjacent ones of the first power conductive posts 241 in the second column (or in the second row). Accordingly, the numbers of the ground pads 210g and the power pads 210p can be maximized, thereby increasing the distribution densities of the ground pads 210g and the power pads 210p.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package substrate, comprising:
   a laminated board including at least a first wiring layer, a second wiring layer, and a third wiring layer, wherein the first wiring layer is located at an outermost side of the laminated board, and the second wiring layer is located between the first wiring layer and the third wiring layer;
   a pad array electrically connected to the first wiring layer, wherein the pad array includes a plurality of power pad groups and a plurality of ground pad groups;
   a plurality of ground conductive structures arranged into a first column in a first direction, wherein at least one of the ground conductive structures includes two first ground conductive posts both extending from the first wiring layer to the second wiring layer, and a second ground conductive post extending from the second wiring layer to the third wiring layer, and wherein the two first ground conductive posts and the second ground conductive post are arranged along the first direction, and the second ground conductive post is located between two orthographic projections of the two first ground conductive posts; and
   a plurality of power conductive structures arranged into a second column in the first direction, wherein at least one of the power conductive structures includes two first power conductive posts both extending from the first wiring layer to the second wiring layer, and a second power conductive post extending from the second wiring layer to the third wiring layer, and wherein the two first power conductive posts and the second power conductive post are arranged along the first direction, and the second power conductive post is located between two orthographic projections of the two first power conductive posts;
   wherein each of the ground conductive structures in the first column and each of the power conductive structures in the second column are not in alignment with each other in a second direction,
   wherein the second direction is perpendicular to the first direction.

2. The package substrate according to claim 1, wherein one of the ground pad groups is arranged between the two first ground conductive posts that are adjacent to each other in the first column.

3. The package substrate according to claim 1, wherein each of the ground pad groups includes a plurality of ground pads, and the ground pads are arranged into a 2×2 array.

4. The package substrate according to claim 1, wherein one of the ground pad groups is located between two adjacent ones of the ground conductive structures and does not overlap with the second ground conductive post in a thickness direction of the laminated board.

5. The package substrate according to claim 4, wherein another one of the ground pad groups overlaps with the second ground conductive post in the thickness direction of the laminated board.

6. The package substrate according to claim 1, wherein one of the power pad groups is arranged between the two first power conductive posts that are adjacent to each other in the second column.

7. The package substrate according to claim 6, wherein each of the power pad groups includes a plurality of power pads, and the power pads are arranged into a 2×2 array.

8. The package substrate according to claim 1, wherein one of the power pad groups is located between two adjacent ones of the power conductive structures and does not overlap with the second power conductive post in a thickness direction of the laminated board.

9. The package substrate according to claim 8, wherein another one of the power pad groups overlaps with the second power conductive post in the thickness direction of the laminated board.

10. The package substrate according to claim 1, wherein the second ground conductive post has a transverse cross-sectional area greater than a transverse cross-sectional area of each of the two first ground conductive posts, and the second power conductive post has a transverse cross-sectional area greater than a transverse cross-sectional area of each of the two first power conductive posts.

11. The package substrate according to claim 1, wherein a connection line between two central points of the second ground conductive post and the second power conductive post that are closest to each other is not parallel to the first direction.

12. The package substrate according to claim 11, wherein the two first ground conductive posts are respectively in alignment with the two first power conductive posts in the second direction.

13. The package substrate according to claim 1, wherein the ground pad groups and the power pad groups are alternately arranged in the second direction.

14. A chip package structure, comprising:
   a chip, wherein the chip includes a plurality of contacts located at a bottom side thereof; and
   the package substrate as claimed in claim 1, wherein the chip is disposed on the package substrate through the contacts, and the contacts correspond in position to the pad array.

* * * * *